United States Patent
Miles et al.

(10) Patent No.: US 11,288,028 B2
(45) Date of Patent: Mar. 29, 2022

(54) DISPLAY DEVICE AND APPARATUS

(71) Applicant: DST Innovations Limited, Bridgend (GB)

(72) Inventors: Anthony Miles, Bridgend (GB); Stephen Hughes, Bridgend (GB)

(73) Assignee: DST Innovations Limited, London (GB)

( * ) Notice: Subject to any disclaimer, the term of this patent is extended or adjusted under 35 U.S.C. 154(b) by 0 days.

(21) Appl. No.: 15/576,380

(22) PCT Filed: Dec. 19, 2016

(86) PCT No.: PCT/GB2016/053985
§ 371 (c)(1),
(2) Date: Nov. 22, 2017

(87) PCT Pub. No.: WO2017/103622
PCT Pub. Date: Jun. 22, 2017

(65) Prior Publication Data
US 2019/0196773 A1    Jun. 27, 2019

(30) Foreign Application Priority Data
Dec. 18, 2015 (GB) .................................... 1522381

(51) Int. Cl.
*G06F 3/14* (2006.01)
*G02F 1/1333* (2006.01)
(Continued)

(52) U.S. Cl.
CPC ........ *G06F 3/1446* (2013.01); *G02F 1/13336* (2013.01); *G09G 5/006* (2013.01);
(Continued)

(58) Field of Classification Search
CPC combination set(s) only.
See application file for complete search history.

(56) References Cited

U.S. PATENT DOCUMENTS 5,986,622 A    11/1999  Ong
6,175,342 B1 *  1/2001  Nicholson .............. G06F 3/147
                                                      345/1.1
(Continued)

FOREIGN PATENT DOCUMENTS

CA    2750668 A    2/2013
EP    1036468 A1   9/2000
(Continued)

OTHER PUBLICATIONS

Search Report for Application No. GB1522381.1, dated Feb. 15, 2016, 4 pages.
(Continued)

*Primary Examiner* — Robin J Mishler
(74) *Attorney, Agent, or Firm* — Butzel Long; Donald J. Lecher

(57) ABSTRACT

Tiled display device (19) comprising an array of display units (18) which are mechanically and electrically coupled to each other by removable data and power connectors (50). The application also discloses a self-powered or partially self-powered display device (1) comprising a display layer (2) and a photovoltaic layer (3) behind the display layer. The display device may also include a light collecting lens system (7) for distributing light to the photovoltaic layer.

14 Claims, 18 Drawing Sheets

(51) Int. Cl.
    *G09G 5/00*      (2006.01)
    *H01R 13/443*    (2006.01)
    *H01R 27/02*     (2006.01)
    *H02J 7/35*      (2006.01)
    *H05K 5/00*      (2006.01)
    *H05K 5/02*      (2006.01)
    *H01R 13/52*     (2006.01)
    *H02J 7/02*      (2016.01)

(52) U.S. Cl.
    CPC ........... *H01R 13/443* (2013.01); *H01R 27/02* (2013.01); *H02J 7/35* (2013.01); *H05K 5/0017* (2013.01); *H05K 5/0204* (2013.01); *G02F 1/133314* (2021.01); *G09G 2300/023* (2013.01); *G09G 2300/026* (2013.01); *G09G 2330/02* (2013.01); *G09G 2370/12* (2013.01); *H01R 13/5219* (2013.01); *H02J 7/025* (2013.01)

(56) References Cited

U.S. PATENT DOCUMENTS

| | | | |
|---|---|---|---|
| 8,947,415 | B1 | 2/2015 | Mowry et al. |
| 9,477,438 | B1* | 10/2016 | Hochman ............ H01R 13/504 |
| 2005/0134526 | A1 | 6/2005 | Willem et al. |
| 2005/0248935 | A1 | 11/2005 | Strip et al. |
| 2009/0103161 | A1 | 4/2009 | Kothari et al. |
| 2011/0148740 | A1 | 6/2011 | Perkins et al. |
| 2011/0249219 | A1 | 10/2011 | Evans et al. |
| 2011/0254877 | A1 | 10/2011 | Mowry et al. |
| 2011/0317121 | A1 | 12/2011 | Lin et al. |
| 2012/0002357 | A1* | 1/2012 | Auld ...................... G09F 21/04 361/679.01 |
| 2012/0091473 | A1 | 4/2012 | Lee et al. |
| 2013/0100149 | A1 | 4/2013 | Dysart |
| 2013/0271973 | A1 | 10/2013 | Rycyna, III |
| 2015/0185791 | A1* | 7/2015 | Hall ........................ G06F 1/183 361/679.21 |
| 2015/0262240 | A1* | 9/2015 | Richardson ........ G06Q 30/0267 705/14.64 |

FOREIGN PATENT DOCUMENTS

| | | |
|---|---|---|
| EP | 1513060 A1 | 3/2005 |
| EP | 1640337 A2 | 3/2006 |
| EP | 1995958 A1 | 11/2008 |
| EP | 2038738 A2 | 3/2009 |
| EP | 2080189 A2 | 7/2009 |
| EP | 2100205 A2 | 9/2009 |
| EP | 2220552 A2 | 9/2009 |
| EP | 2232382 A1 | 9/2010 |
| EP | 2232472 A1 | 9/2010 |
| EP | 2761423 A2 | 8/2014 |
| EP | 2955626 A2 | 12/2015 |
| GB | 2511549 A | 9/2014 |
| JP | 2007536708 | 12/2007 |
| JP | 3160260 U | 6/2010 |
| JP | 2012508402 | 4/2012 |
| KR | 20130056999 | 5/2013 |
| RU | 83649 U1 | 6/2009 |
| WO | WO-2005043228 A2 | 5/2005 |
| WO | WO-2011113145 A1 | 9/2011 |
| WO | WO-2011133553 A1 | 10/2011 |
| WO | WO-2014118427 A1 | 8/2014 |
| WO | WO-201549536 A1 | 4/2015 |

OTHER PUBLICATIONS

Decision to Grant for Application No. 2018126362, dated Mar. 12, 2019, 14 pages.

European Examination Report dated Feb. 15, 2018 issued in EP Application No. 16831578.6.

International Search Report and Written Opinion dated Jun. 26, 2017 as received in Application No. PCT/GB2016/053985.

Japanese Office Action (including English translation) for App. No. JP2018-550871, dated Jan. 5, 2021, 10 pages.

* cited by examiner

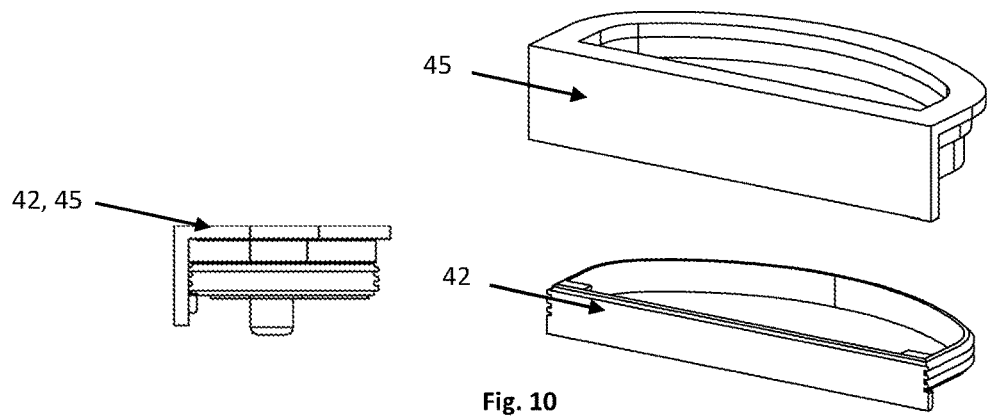
Fig. 10
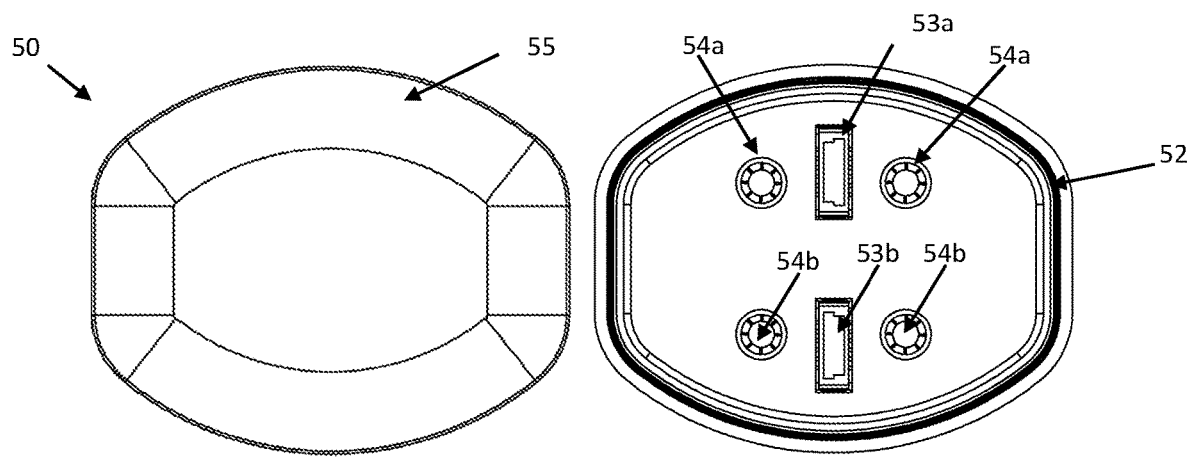
Fig. 11a
Fig. 11b
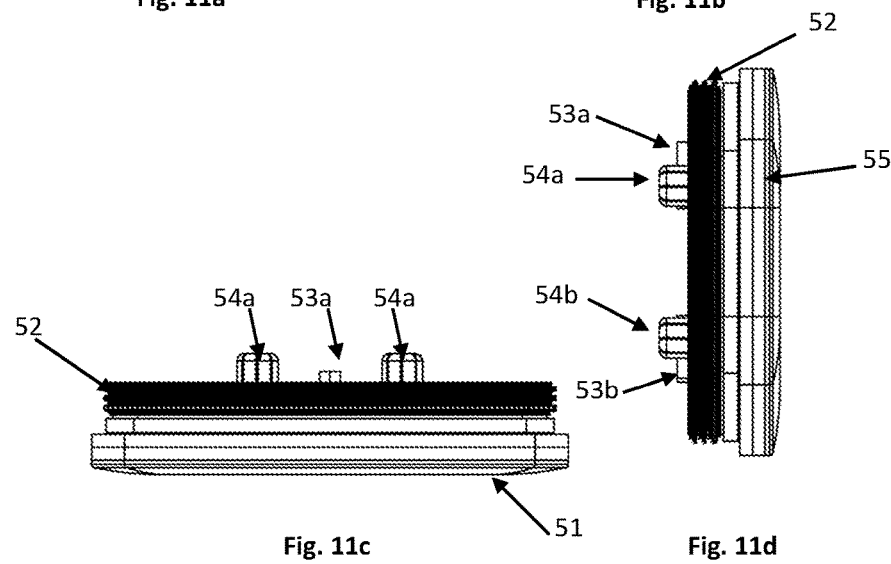
Fig. 11c
Fig. 11d

DISPLAY DEVICE AND APPARATUS

FIELD OF THE INVENTION

The invention relates to a display device, and apparatus using such a display device.

BACKGROUND OF THE INVENTION

The increasing processing and computational demands imposed upon electronic devices, coupled with the development of larger and higher resolution display units, leads to higher rates of power consumption in said devices. It would therefore be desirable to integrate energy harvesting into these electronic devices for self-powering or partial self-powering.

It is known to arrange modular display devices in an array, for providing a large display area. However, greater flexibility is desirable in the operation of these arrays.

SUMMARY OF THE INVENTION

According to one aspect of the present invention there is provided a self-powered or partially self-powered display device that can be powered through photovoltaic energy generation utilising a photovoltaic layer which may be integrated into the display itself, and may be positioned under a light-emitting layer of the display device. In embodiments of the invention the display device may also include a light collecting lens system for distributing light to the photovoltaic layer.

According to another aspect of the invention there is provided an array of wirelessly communicating self-powered or partially self-powered display units which comprise display devices which comprising photovoltaic layers. In embodiments of the invention the display units of the array of display units may comprise rechargeable power cells. There may be provided means to transfer electrical charge between the display units of the array of display units. In further embodiments the display units may include sound emitting devices which emit sound that sounds to the listener as if it is being directly emitted from the display device of the display unit. In further embodiments where the display units are arranged in an array, the emitted sound can be unified across all the displays, or sound can move dynamically across the display units of the array, or a combination of both the unified and dynamic sound can be output.

According to another aspect of the invention there is provided an array of display units, with adjacent edges of the display units being connected together by a removable power and data connector that provides power, data and mechanical connections between the display units.

BRIEF DESCRIPTION OF THE DRAWINGS

Following, by way of example only, are descriptions of the drawings which are to serve illustrative purposes only. Alternative embodiments that may become apparent are also claimed.

FIG. 10 shows the parts that make up the blank plug.

FIGS. 11a to 11d show top, bottom and side views respectively of a plug for interconnecting the display units.

DETAILED DESCRIPTION OF THE EMBODIMENTS OF THE INVENTION

Display Device Construction

Figure 1:
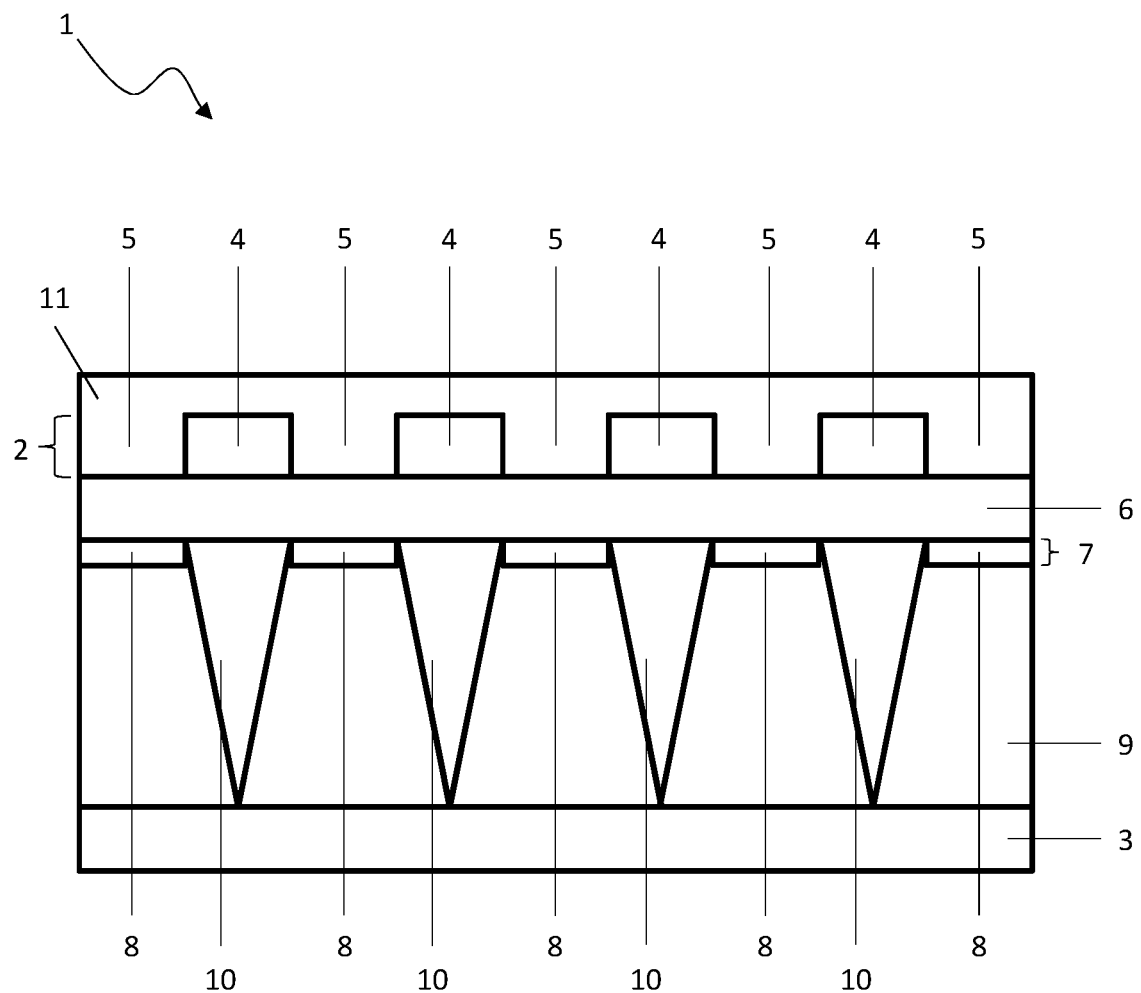
FIG. 1 shows a schematic cross sectional diagram of the arrangement of a display with an integrated photovoltaic layer according to an embodiment of the invention.

FIG. 1 is a cross sectional diagram illustrating the structure of a display device 1 incorporating a light emitting display layer 2 and photovoltaic layer 3. The photovoltaic layer 3 is positioned underneath the light emitting display layer 2 such that light rays can pass through gaps 5 between light emitting elements 4 of the light emitting display layer 2 thereby reaching the photovoltaic layer 3 for power generation, which may be for self-powering or partially self-powering the display device 1.

In this embodiment, the light emitting elements 4 are arranged on a transparent substrate 6 comprising transparent circuitry connecting the light emitting elements 4, to allow for the maximum possible amount of incident light to reach the photovoltaic layer 2. In other embodiments the substrate and circuitry 6 can be any combination of a transparent substrate or semi-transparent substrate, with the circuitry being transparent, semi-transparent, non-transparent or comprising a mixture of transparent semi-transparent and non-transparent components. The substrate and circuitry 6 are preferably fabricated as a flexible layer using flexible electronics. In other embodiments the substrate and circuitry 6 can be fabricated using semi-flexible or non-flexible components.

In some embodiments the display device 1 may comprise, instead of the light emitting display layer 2 comprising light emitting elements 4, a light reflecting display layer and light reflecting components.

In the embodiment shown in FIG. 1, a light collection lens system 7 is positioned above the photovoltaic layer 3. The light collection lens system 7 comprises an array of lenses 8 positioned in the gaps 5 between the light emitting elements 4 of the light emitting display layer 2. The purpose of the light collecting lenses 8 is to distribute the light rays incident on the display across the entire photovoltaic layer 3 rather than only the areas underneath the gaps 5 between the light emitting elements 4. This is described in further detail below.

The light collection lens system 7 in some embodiments is incorporated into the bottom side of the substrate 6. In other embodiments the light collection lens system 7 is integrated into a separate substrate and positioned at an optically optimal position in the device structure. In some embodiments the light collection lens system 7 is formed from at least one thin sheet onto which a lens pattern is embossed, the sheet being of plastic or any other suitable material.

With reference to the embodiment present in FIG. 1, a light guide layer 9 is positioned between light collection lens system 7 and the photovoltaic layer 3. This light guide layer 9 is used to ensure as much light as possible reaches the photovoltaic layer 3 from that which is collected. In other embodiments the light guide layer 9 can be positioned above the light collection lens system 7 to direct as much light as possible to the light collection lens system 7 before the photovoltaic layer 3. In some embodiments the light collection lens system 7 and/or the light guide layer 9 are not present. In such embodiments the photovoltaic layer 3 may be positioned directly underneath the transparent substrate and circuitry 6. The light guide layer may be made from any material that can trap light inside its structure and channel it to a predetermined location, for example a glass, plastic or transparent resin material.

In the embodiment shown in FIG. 1 a series of conical shaped optical elements 10 are positioned under the light emitting elements 4. These conical shaped optical elements 10 are used to diminish the effects of shadowing of incident light from the light emitting elements 4 located above them, thus allowing for incident light to reach as much of the photovoltaic layer 3 as possible.

A protective layer 11 is positioned above the light emitting display layer 2 in the embodiment displayed in FIG. 1. The purpose of this protective layer 11 is to protect the light emitting elements 4 from damage, typically by water and/or UV radiation. In some embodiments the protective layer 11 is transparent; in other embodiments the protective layer 11 is semi-transparent.

The display technology used in the light emitting display layer 2 may include, but is not limited to, LED displays, OLED displays, LCD displays and the like. In preferred embodiments the light emitting display layer 2 is fabricated from flexible components; however in other embodiments the light emitting display layer 2 can be fabricated from semi-flexible or non-flexible components. The photovoltaic layer 3 may be constructed of, but not limited to, organic photovoltaics, silicon photovoltaics, thin film photovoltaics and the like. In preferred embodiments the photovoltaic layer 3 is fabricated from flexible components; however in other embodiments the photovoltaic layer 3 can be fabricated from semi-flexible or non-flexible components.

Figure 2:
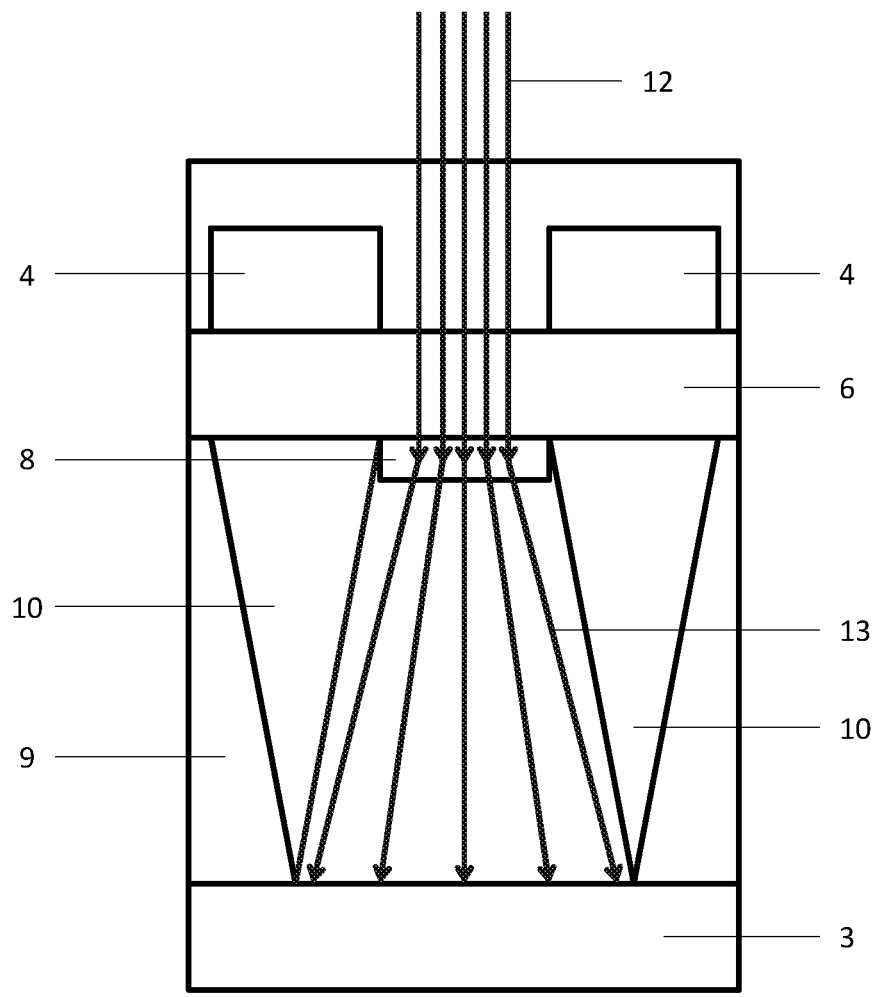
FIG. 2 shows a diagram depicting the operation of a light collection lens system according to the embodiment in FIG. 1.

FIG. 2 illustrates the operation of the light collecting lens system 7 previously introduced. The incident light rays 12 which are incident upon the gaps 5 between the light emitting elements 4 are refracted by the light collection lenses 8 of the light collection lens system 7. The lenses 8 act as diverging lenses refracting the incident light rays 12 outwards across the photovoltaic layer 3. The refracted light rays are transported to the photovoltaic layer 3 by the light guide layer 9 where they are absorbed for photovoltaic power generation. In other embodiments the light collecting lens system 7 comprises converging lenses which focus the light rays onto specific areas of the photovoltaic layer 3. This embodiment has the advantage that an array of small photovoltaic cells is required, thus using less photovoltaic material.

Figure 3:
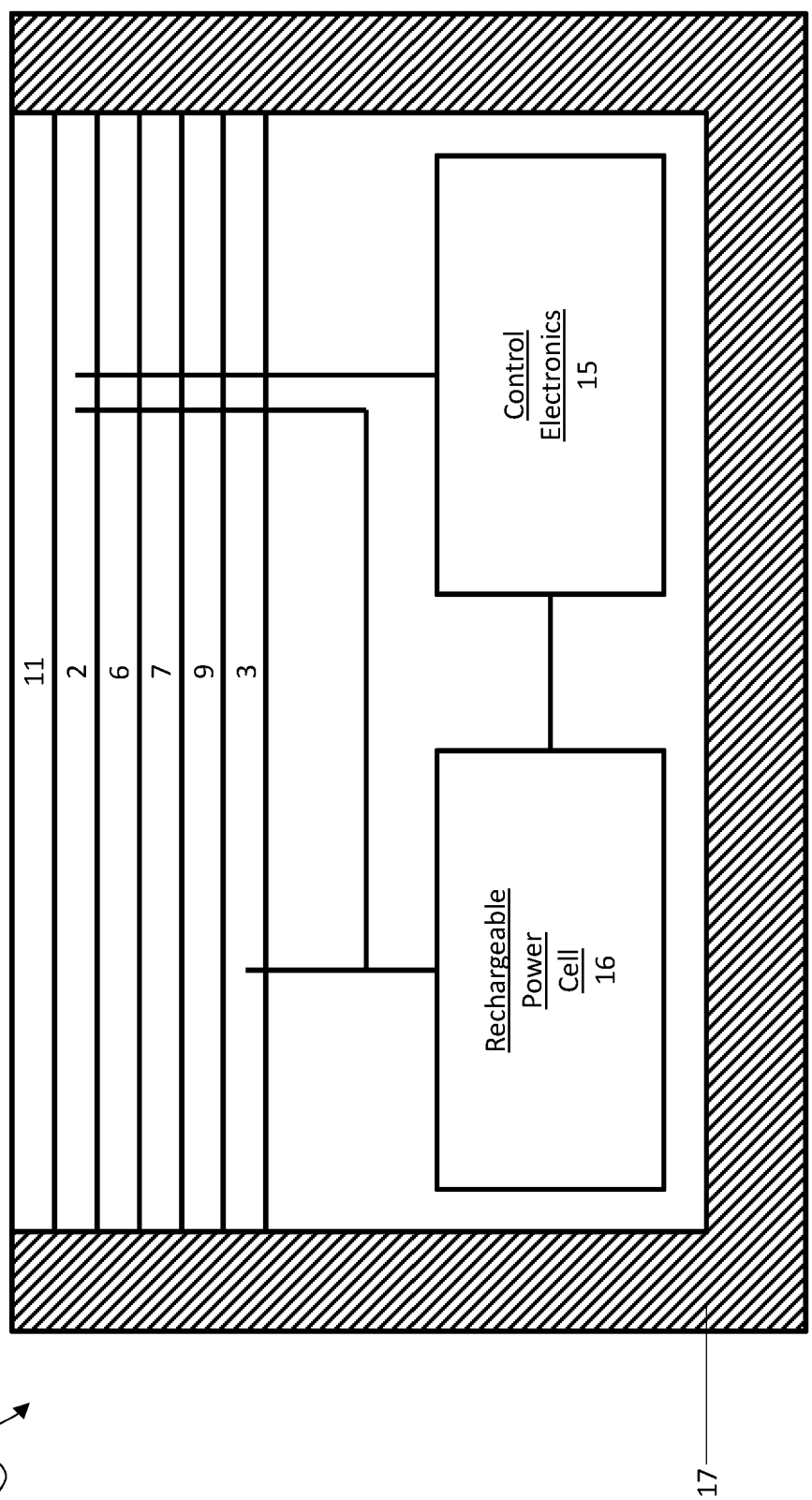
FIG. 3 is a schematic cross sectional diagram of an embodiment of a display unit with an energy harvesting photovoltaic layer integrated into the display itself.

FIG. 3 shows an exemplary arrangement for a self-powered or partially self-powered display device 14 comprising a light emitting display layer 2 and photovoltaic layer 3. The light emitting display layer 2 is electrically connected to the control electronics 15 which are in turn connected to a rechargeable power cell 16. The photovoltaic layer 3 is also connected to the rechargeable power cell 16. In embodiments the control electronics 15 can include, but are not limited to, data storage, micro-processing and power management means. In operation the control electronics 15 send data signals to the display 1 for an image or images which are to be displayed. Simultaneously, ambient light 12 which is incident on the display 1, and passes through the display layer 2, is absorbed by the photovoltaic layer 3 so as to generate power to charge the rechargeable power cell 16 in the device 14. In other aspects the photovoltaic layer 3 can charge the rechargeable power cell 16 when the display 1 is not in use. The self-powered or partially self-powered device 14 is encased in a casing 17 which can be either a flexible, semi-flexible or non-flexible material.

Figure 4:
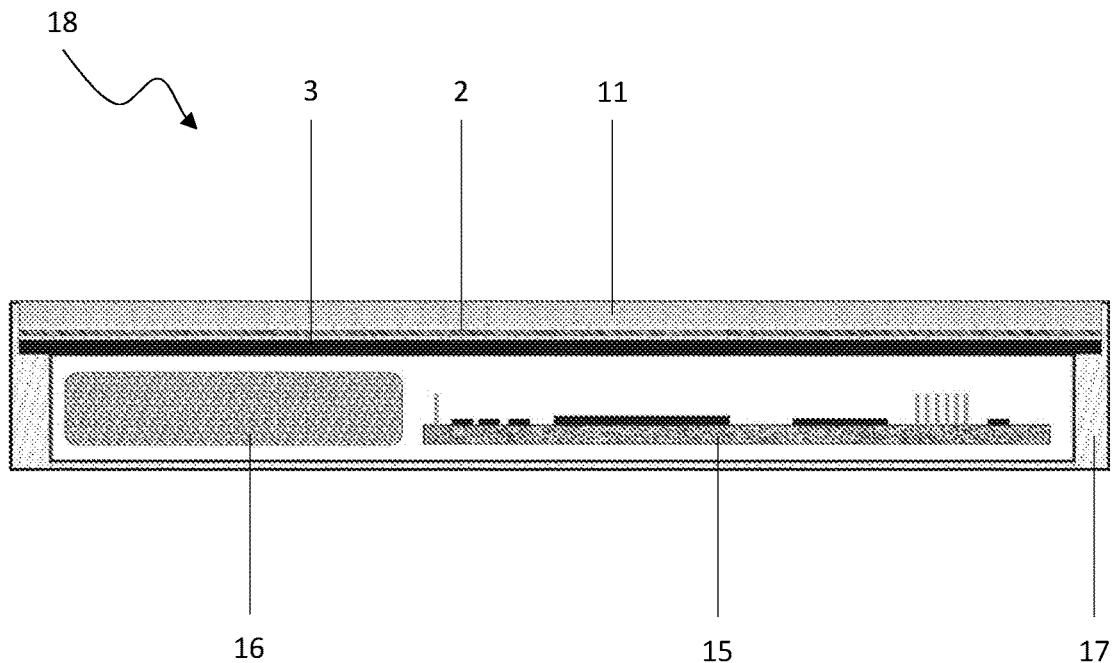
FIG. 4 is a cross-sectional diagram of another embodiment of a display unit.

FIG. 4 demonstrates an exemplary display unit 18 incorporating the self-powering or partially self-powering display device 1 described herein. In this embodiment the display unit 18 comprises a light emitting or reflecting display layer 2, between a protective layer 11 and a photovoltaic layer 3. The display device 1 is connected to a rechargeable power cell 16 and control electronics 15. The control electronics 15 control the information which is sent to an array of light emitting elements 4 in display layer 2, manages the energy collected by the photovoltaic layer 3, and manages the rechargeable power cell charging and energy usage. In other embodiments display unit 18 also includes combinations of the light collecting lens system 7, the light guiding layer 9 and the conical optical elements 10.

Figure 5:
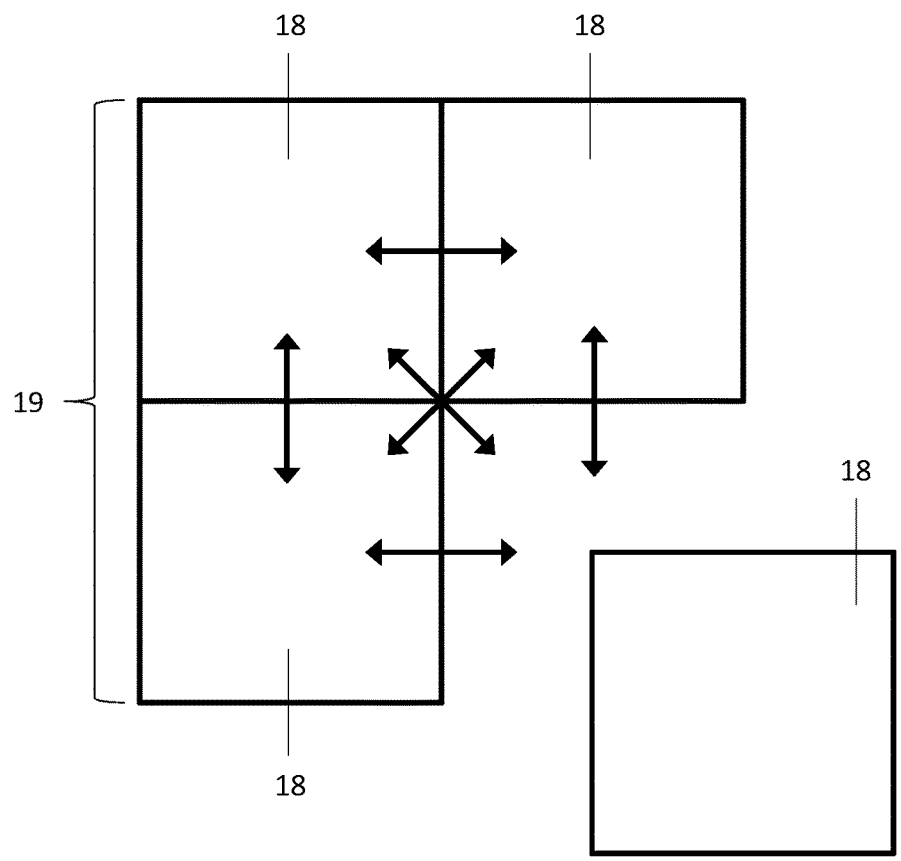
FIG. 5 shows an array of display units according to embodiments of the invention.

In some embodiments the display unit 18 includes sensors on the peripheries of the display unit 18. The sensors are able to detect other nearby display units 18 of the same type. In such embodiments the display unit 18 also includes means for wireless communication with the nearby display units. The wireless communication may be carried out by a direct (e.g. P2P) or networked wireless connection suitable to transfer the required amount of data, for example Wi-Fi or Bluetooth® wireless connections. The display units are able to communicate with one another. In embodiments, multiple display units 18 can wirelessly communicate with one another forming an array of display units as is shown in FIG. 5, which shows an exemplary array 19 of four display units 18. These display units 18 each interact with one another when in close proximity, as is shown by the arrows indicating the directions of communication between each of the display units 18. The sensors at the peripheries of each display unit 18 allow for the display unit 18 to identify its orientation with respect to each of the other display units 18, for example by detecting an electromagnetic field of transition, by using proximity sensors, or other known methods. In such an embodiment a first display unit 18 displays an image, and when a second unit 18 is brought within proximity of the first display unit 18 the image displayed on the first unit 18 is shared across both the first and second display units 18 in the most logical manner based upon their orientation with respect to one another.

In some embodiments, in the event that the first and second display units 18 are displaying different data when brought into proximity with one another, a choice can be made between the two sets of data to display across the first and second display units 18, or one set is given priority, depending for example on a mode setting on the display units 18 or a remote controller. The same protocol may apply as more display units 18 are introduced to the array, as in FIG. 5 where a third display unit 18 is included in the array.

As the fourth display unit 18 (the lower rightmost display unit 18 in FIG. 5) is brought closer to the array 19 it will be detected by the first, second and third display units 18 and the display data will be distributed across all four display units 18 as they all interact with one another. The distance required for a display unit 18 to be detected by other display units 18 in the array 19, and thus incorporated into the array 19, is programmable and can be set in a system administration application. In embodiments the display data is shared amongst the display units in the array by the means for wireless communication. In addition to display data, in some embodiments, processing resources are also shared between the display units 18 in the array 19.

In further embodiments different display information may be displayed on each display unit 18 of said array 19. In such embodiments the display data on each display unit 18 can be distinct from display data on other units, but also associated with the display data of the other display units as part of a collective display image.

In further embodiments, where the display units 18 are arranged in an array 19, in the event that one or more units 18 fails to function correctly, the still functioning units 18 will reconfigure to display the display data in the most logical way. In such an embodiment, when replacing the failing display unit 18 with a new properly functioning display unit 18, the new display unit 18 will automatically configure itself to carry out the same functions and display the same data as the failed display unit 18. In further embodiments a technical diagnostic signal or report is sent to the administrator of the array 19 when one or more units fail to function correctly.

Figure 6:
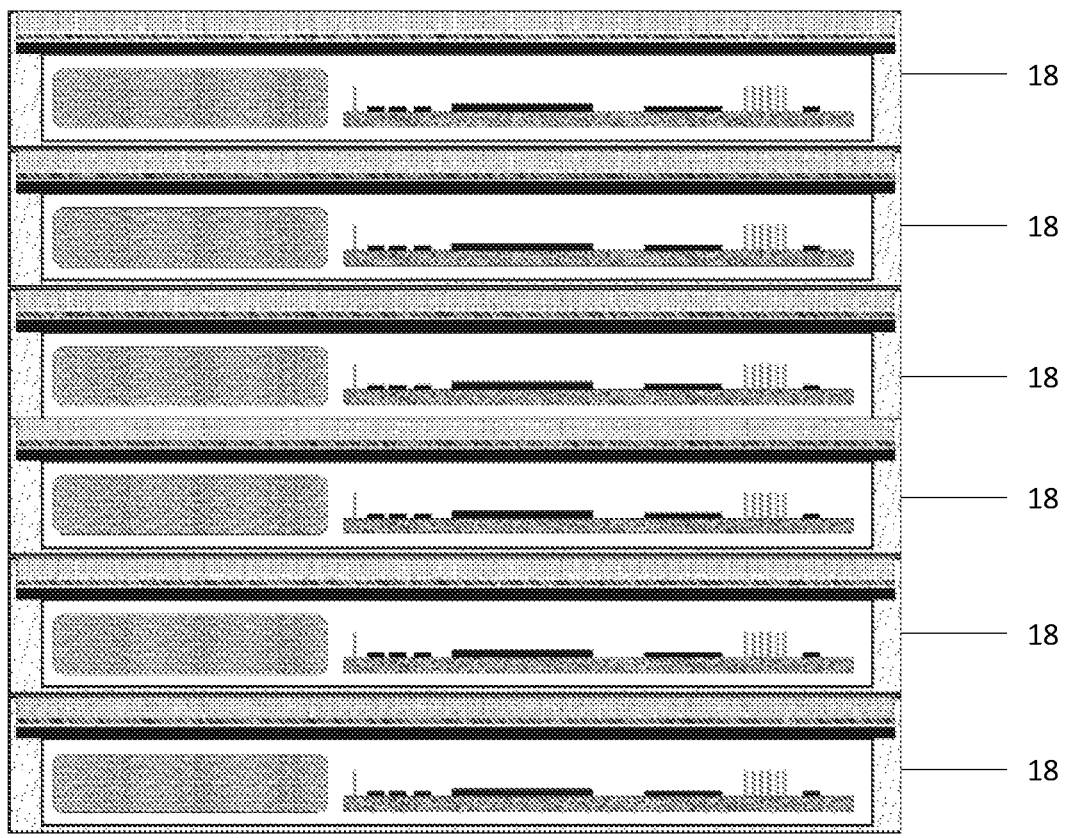
FIG. 6 shows a stack of display units according to embodiments of the invention.

In some embodiments the display units 18, when arranged within close proximity to one another, share stored electrical charge with one another through means for wired or wireless exchange of electrical charge through techniques known in the art, such as inductive charging. FIG. 6 depicts a stack of display units 18 of such an embodiment; however stored electrical charge can also be shared between display units when arranged in array 19 such as that in FIG. 5, or any other orientation when located proximately to one another. With reference to the embodiment of FIG. 6, by way of example only, within the stacked collection of display units 18 a master unit is assigned. In other embodiments this process also occurs when the display units 18 are arranged in an array such as that in in FIG. 5, or any other orientation when located proximately to one another. Each of the display units 18 in proximity to the master unit will identify themselves to the master unit; the master unit will manage the electrical charge stored in each display unit by instructing the exchange of electrical charge between display units 18 such that after a period of time each display unit in the collective will contain an approximately equal level of electrical charge. In embodiments the electrical charge stored in the display units 18 is harvested through photovoltaic power generation in the photovoltaic layer 3. In other embodiments the electrical charge stored in the display units 18 is supplied by an external power supply. In other embodiments the electrical charge stored in the display units 18 is supplied by a combination of photovoltaic power generation and an external power supply. In further embodiments the master unit 18 can be charged from a power supply, such as a mains power supply, and transfer electrical charge to each of the other display units in the collective until each display unit 18 is fully charged.

In some embodiments the display unit 18 comprises a sound emitting unit designed to emit sound such that from the perspective of a listener the sound is being transferred directly from the front of the display unit 18. The sound emitting unit may be a conventional speaker, and preferably a relatively thin/flat speaker integrated into the display unit 18.

In embodiments where two or more display units 18 are arranged in an array as described previously, such as in FIG. 5, the emitted sound can be arranged to be transmitted from both units as a unified sound. In other embodiments the emitted sound can be arranged to be transmitted from each unit so as to dynamically arrange sounds which can move across display units 18 of the array. In further embodiments, combinations of unified sounds and dynamically arranged sounds are emitted from an array 19 of display units 18. The emitted sound may be controlled by the control electronics 15 of one or more of the display units.

Connection Arrangement

Figures 7A, 7B:
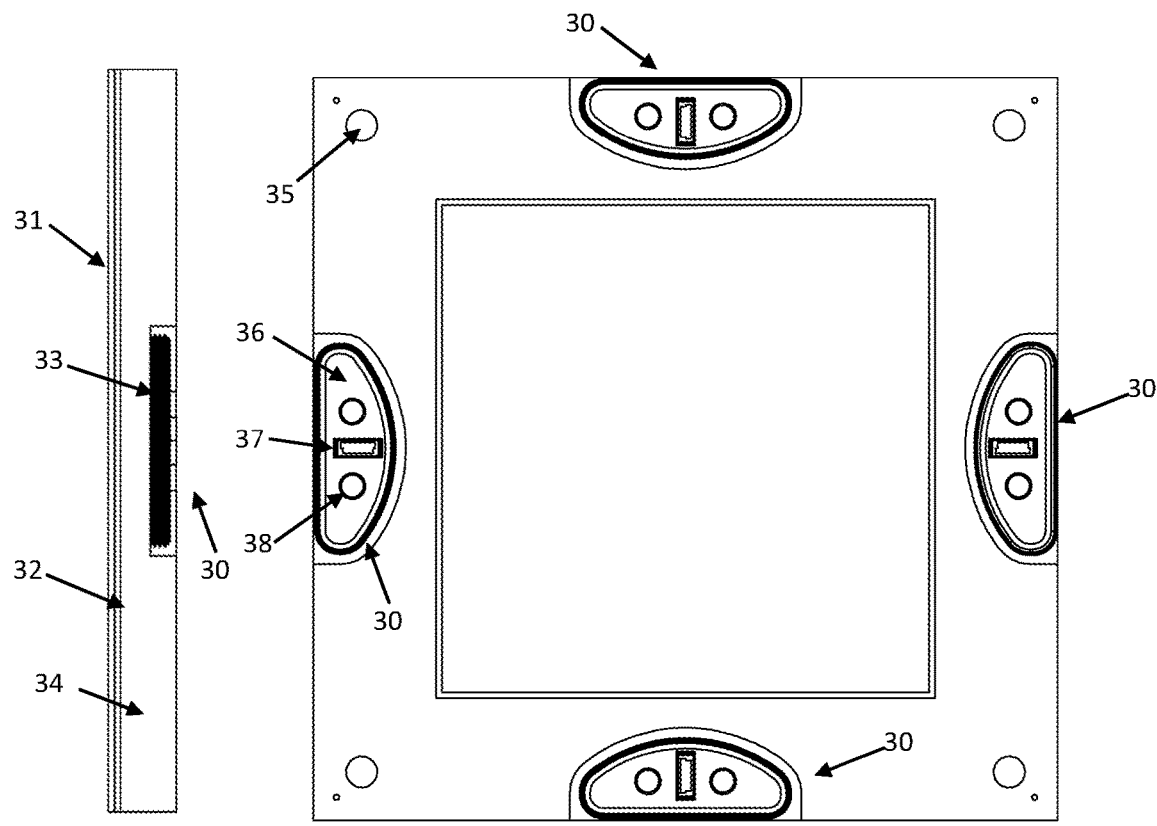
FIGS. 7a and 7b show a back and side view respectively of a display unit incorporating a fixing arrangement according to an embodiment of the invention.
Figure 8:
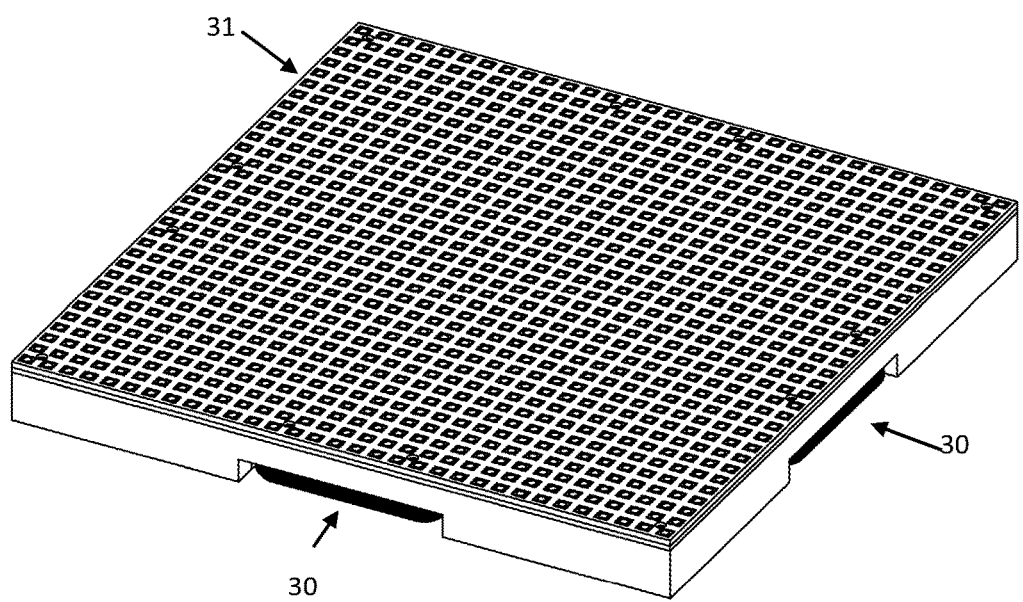
FIG. 8 shows a perspective view of the display unit of FIG. 7, with display side and protective cover face up.

A connection arrangement for the display units is shown in FIGS. 7 to 20. In this connection arrangement, as shown in FIGS. 7a, 7b and 8, each display unit 18 is square or rectangular in shape and has a combined power and data socket 30 on each of two or more sides, located preferably on the back surface adjacent an edge of the display unit 18.

The front face 31 of the display unit 18 comprises a protective grid that is designed to provide protection to the display components. The protective grid may also enhance the contrast of the display. A display surface 32 of the display unit may be constructed as described above and may include a photovoltaic layer to collect energy, or may be made using a conventional display technology.

Each socket 30 comprises a connection mount 36, a data connection socket 37, and power connection sockets 38. The data connection socket 37 may comprise an HDMI, USB or other socket. The connection mount 36 is arranged to receive a plug as described further below, and to align the plug with the data and power connection sockets 37, 38.

Figure 9A:
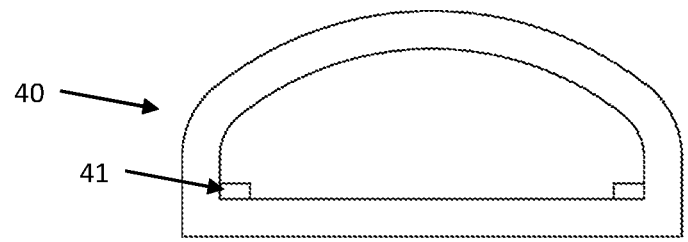
FIGS. 9a to 9c show top, side and bottom views respectively of a blank plug for insertion into a socket of the display unit.
Figure 9B:
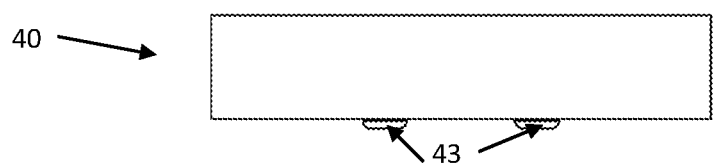
Figure 9C:
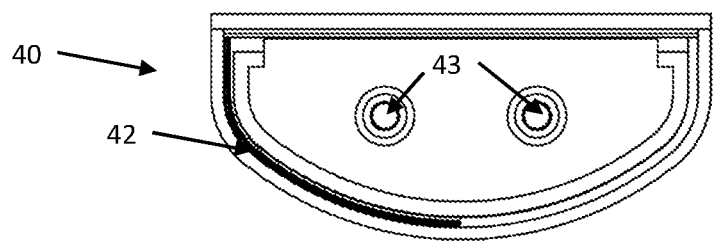

Each socket 30 preferably includes a waterproof gasket 33 that provides a seal around the perimeter of the socket 30 to ensure a good fit and for moisture resistant protection. An outer casing 34 provides a weatherproof protective cover for internal electronic components. A fitting 35, such as a press fit or screw fitting, is provided on the back surface at or near each corner, and is used to fasten the display unit 18 to a mounting bracket 80 or directly to a frame. FIGS. 9a to 9c show a blank plug 40 for insertion into the socket 30 when not in use, in order to seal the socket 30 against dust and/or liquid ingress. As shown in FIG. 9a, the outer face of the blank plug 40 includes one or more grip portions 41 to facilitate insertion or extraction of the blank plug 40. As shown in FIGS. 9b and 9c, a gasket section 42 seals against the edge of the socket 30. Non-conductive pins 43 fit into the power connection sockets 38, to provide a further barrier to liquid ingress. Optionally, a blank data connector plug (not shown) within the blank plug 40 may fit into the data connection socket 37.

As shown in FIG. 10, the blank plug 40 comprises a main body part 45 and the gasket section 42 which are assembled together.

FIGS. 11a to 11d show a connector plug 50 that fits across and into adjacent sockets 30 of adjacent display units 18 so as to provide a data and power connection therebetween, without the need for cables. The connector plug 50 comprises a plug cover 51 and a gasket 52 for sealing against the perimeters of the adjacent sockets 30. First power connector pins 54a for connecting to the power connection sockets 38 of one socket 30 are electrically connected within the connector plug 50 to second power connector pins 54b for connecting to the power connection sockets 38 of the other adjacent socket 30. First data connector plug 53a (e.g. an HDMI plug) for connection to the data connection socket 37 of one socket 30 is interconnected within the connector plug 50 to second power connector plug 53a (e.g. an HDMI plug) for connecting to the data connection socket 37 of the other adjacent socket 30. Hence, the power and data connections between adjacent sockets 30 are provided within the connector plug. This arrangement provides a safe and easy method of construction for interconnecting the display units 18 into a large array 19, and provides structural integrity to the array 19, as the connector plug 50 provides a substantially rigid mechanical connection between the adjacent display units..

Figure 12:
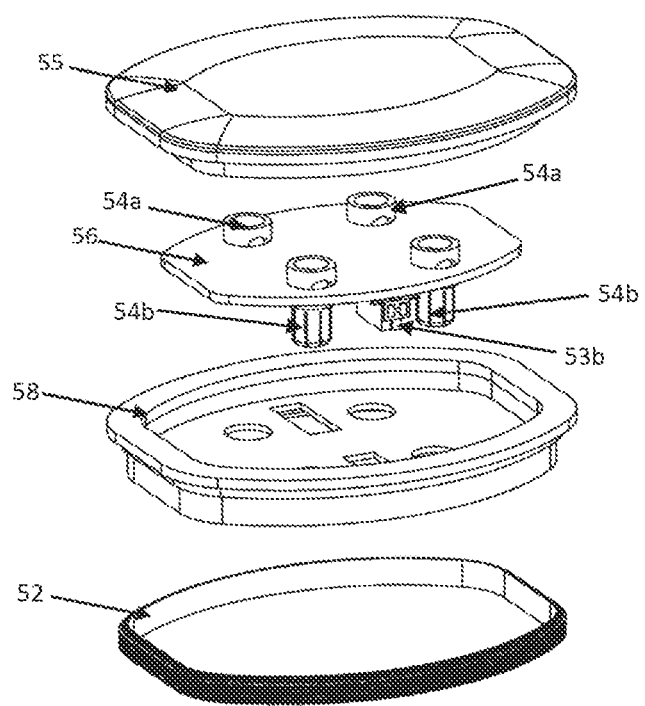
FIG. 12 is an exploded view of the parts of the plug of FIG. 11.
Figure 13A:
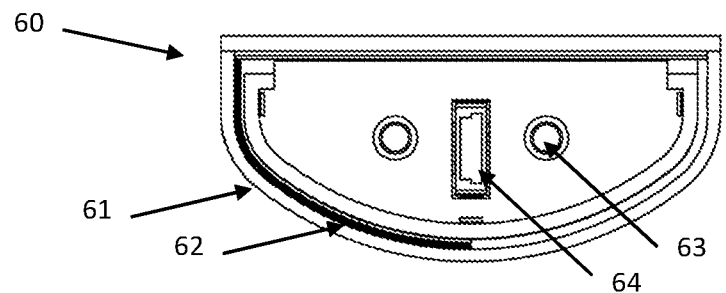
FIGS. 13a to 13d show a bottom view, side view, front view and top view of a video input plug for use with the display units.
Figures 13B, 13C:
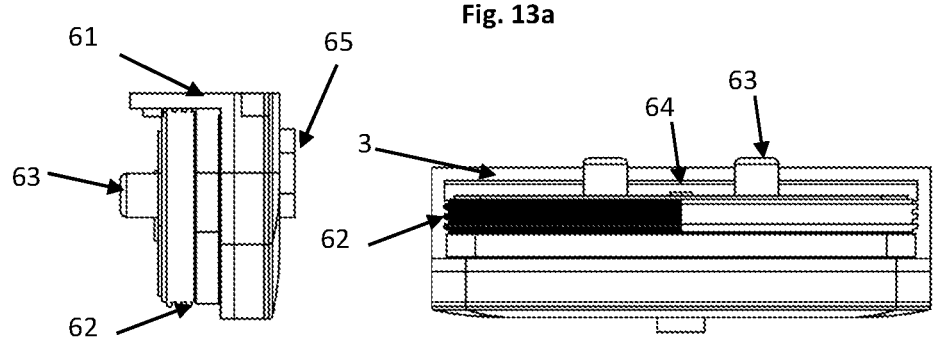
Figure 13D:
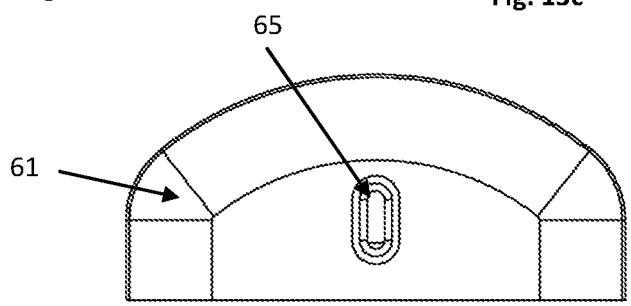

FIG. 12 shows the components of the connector plug 50, comprising the plug cover 55, a circuit board 56 to which the power connector pins 54a, 54b and data connector plugs 53a, (not shown in FIG 12. ), and 53b are connected, a main body 58 for protecting the electronic components and a gasket 52 to protect the connector plug 50 from liquid ingress.

FIGS. 13a to 13d show a data input plug 60 for connection to one of the sockets 30, for example at an edge of the array 19, for providing a data input to the array 19 from an external source, such as a video source. The data input plug 60 comprises a cover 61, a gasket 62 for sealing against the periphery of the socket 30, data connector plug 64 and power connector pins 63. A cable aperture 65 provides access to an external cable that is connected to the data connector plug 64, for connection to the external source. The power connector pins 63 may be non-conductive blank pins, or may be conductive pins if the data input plug also functions as a power input plug.

Figure 14:
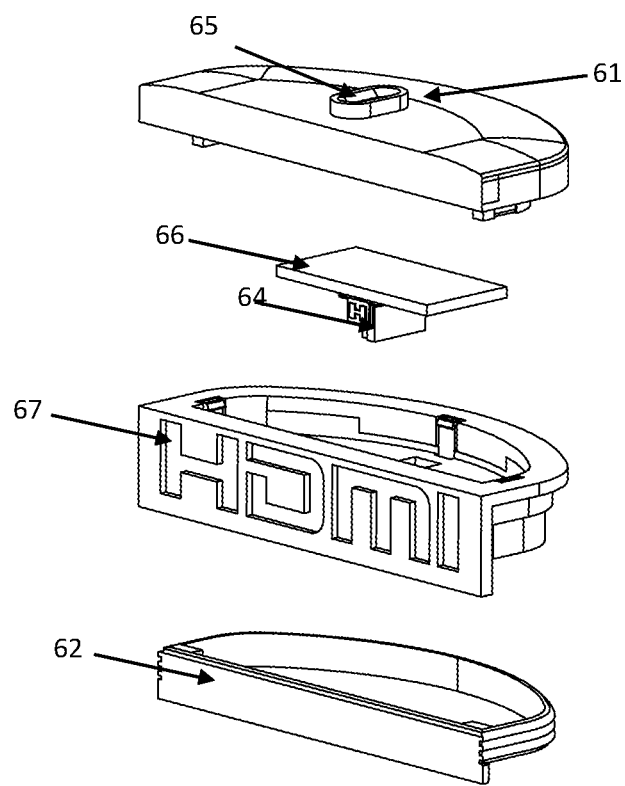
FIG. 14 is an exploded view of the video input plug of FIG. 13.
Figure 15A:
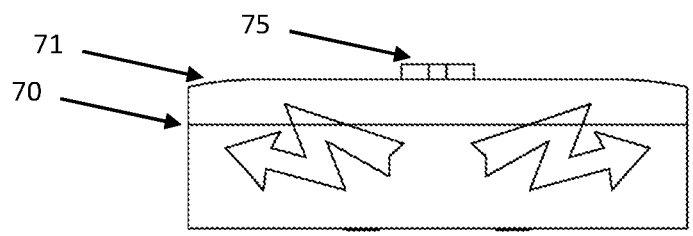
FIGS. 15a to 15d are bottom, front, back and side views respectively of a power input plug for the display units.
Figure 15B:
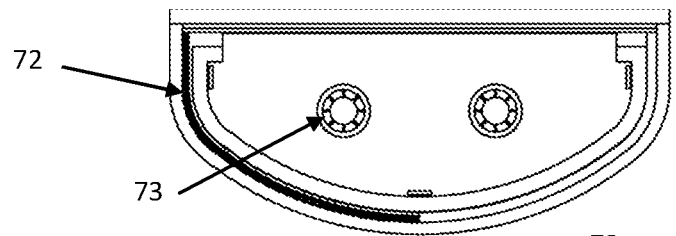
Figure 15C:
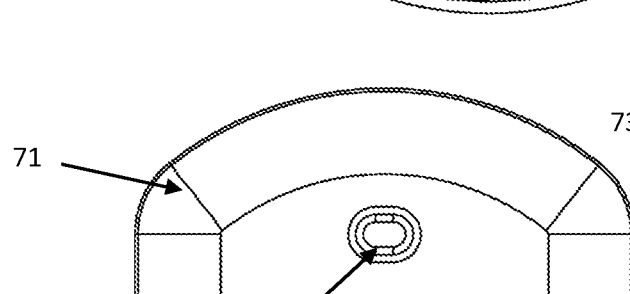
Figure 15D:
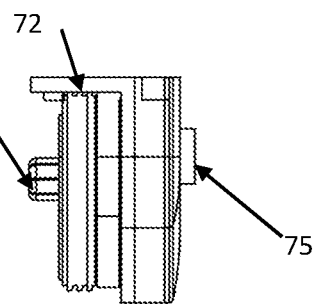

FIG. 14 shows the components of the data input plug 60, comprising the cover 61, a circuit board 66 to which the data connector plug 64 is connected, a main body 67 and the gasket 62.

FIGS. 15a to 15d show a power input plug 70 for connection to one of the sockets 30, for providing a power input to the array 19 from an external power source. The power input plug 70 comprises a cover 71, a gasket 72 for sealing against the periphery of the socket 30, and power connector pins 73. A cable aperture 75 provides access to an external power cable electrically connected to the power connector pins 73.

Figure 16:
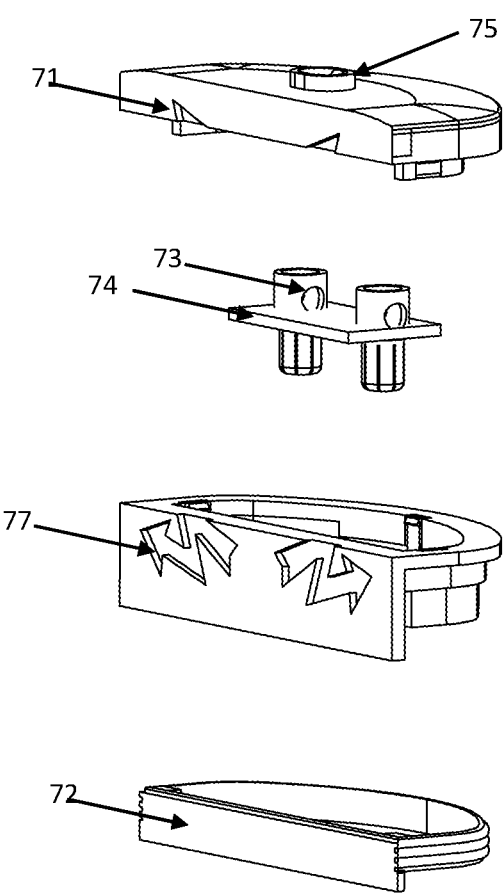
FIG. 16 is an exploded view of the power plug of FIGS. 15a to 15d.

FIG. 16 shows the components of the power input plug 70, comprising the cover 71, a circuit board 76 to which the power connector pins is connected, a main body 77 and the gasket 62.

Figure 17:
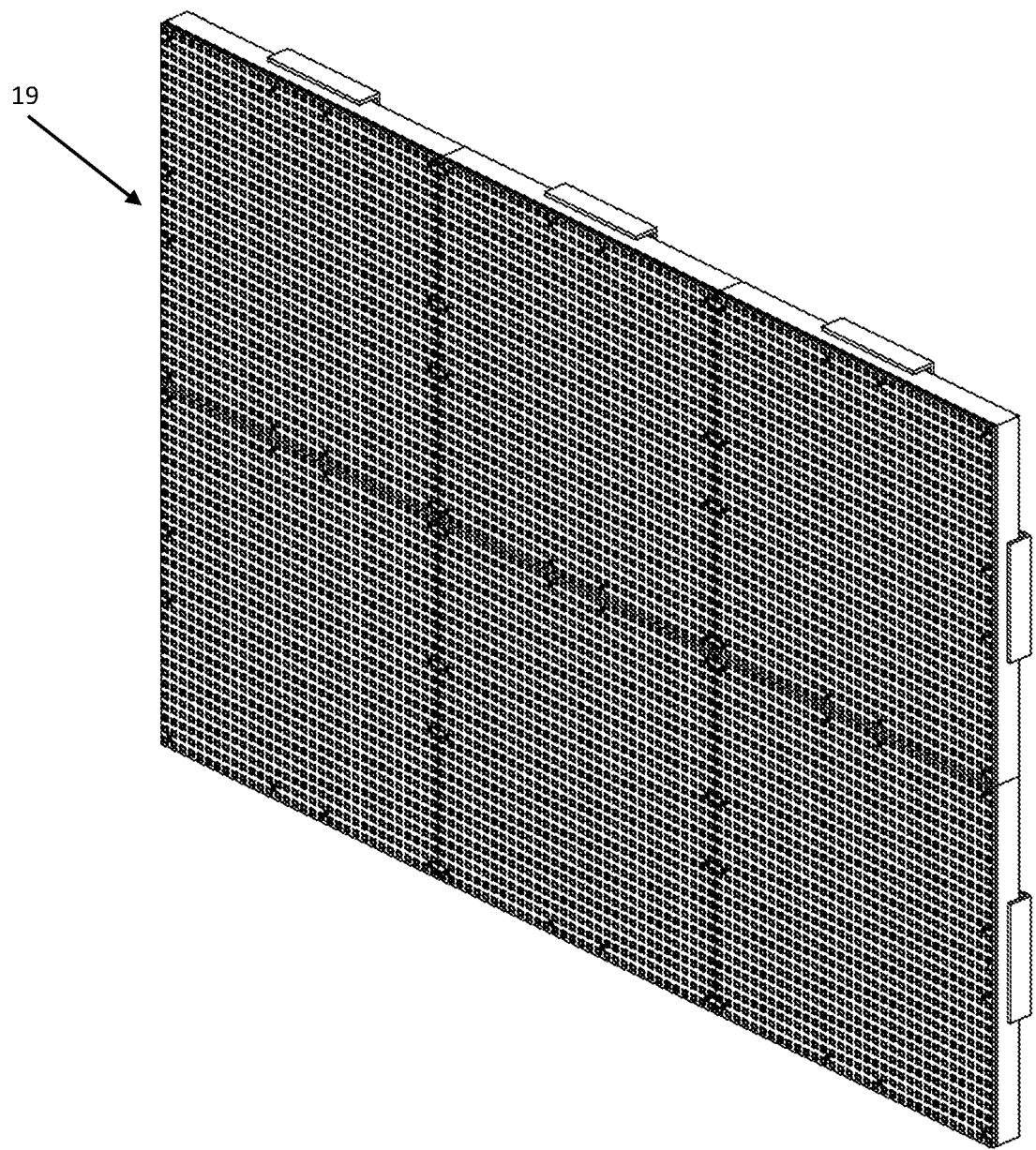
FIG. 17 is a front view of a large format display assembled from a plurality of the display units.
Figure 18:
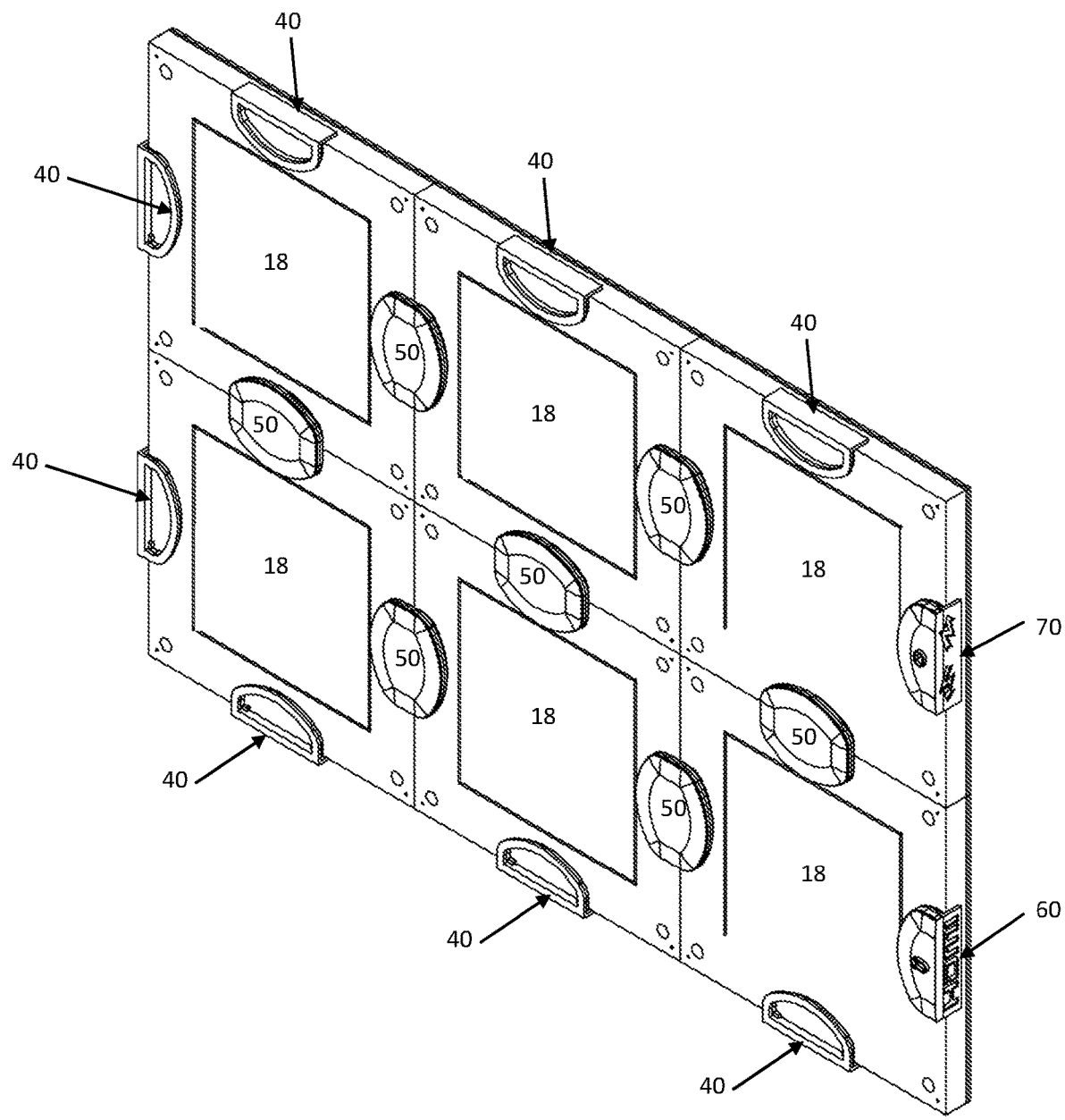
FIG. 18 is a back view of the display of FIG. 17.

FIGS. 17 and 18 show a large format display comprising an array 19 of 3×2 display units 18 interconnected with the connector plugs 50 across the respective sockets 30 of their adjacent sides. On external sides of the display units 18 at the edges of the array, the sockets 30 are preferably sealed using the blank plugs 40, apart from one socket 30 that receives the data input plug 60 and another socket 30 that receives the power input plug 70. Alternatively, one socket 30 on an external side may receive a combined power and data input plug. Thus, multiple display units 18 may be connected together easily into the array 19 using the different plugs, which may provide structural integrity, fast and easy assembly, safe and plug and play functionality, and/or easy access for maintenance.

Figure 19A:
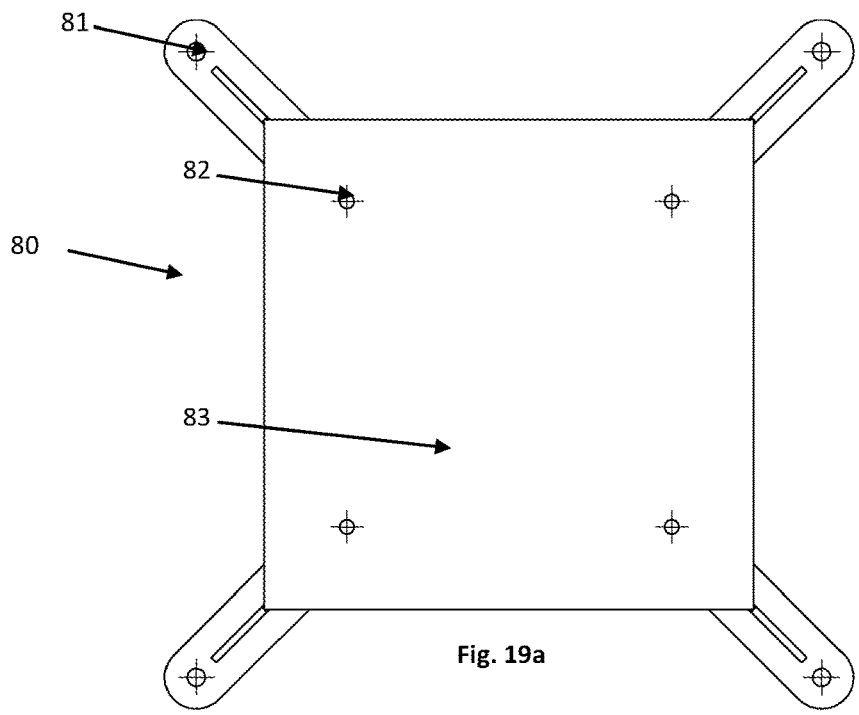
FIGS. 19a, 19b and 19c are back, cross-sectional and perspective views respectively of a bracket for mounting the display.
Figure 19B:
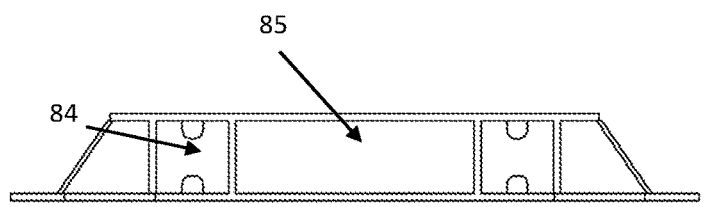
Figure 19C:
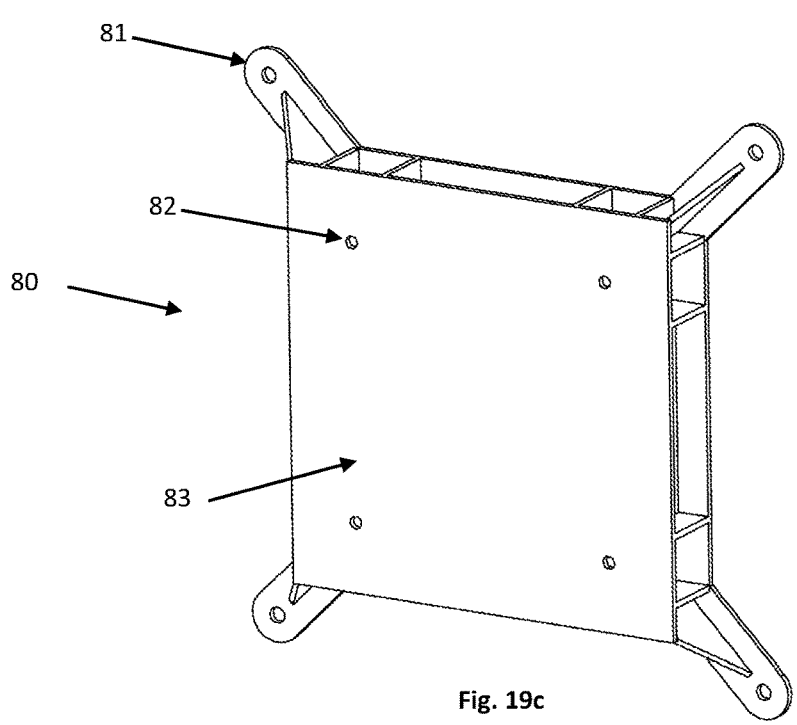

FIGS. 19a to 19c show a mounting bracket 80 for the display unit 18, comprising a main body 83 having a plurality of arms 81 fixed thereto. Each arm 81 has a hole or other means for attachment to the corresponding fitting 35 on the back of the display unit 18.

The main body 83 has a hollow rigid construction that provides stability. The main body 83 includes cavities 84 for receiving supporting bars 90 for supporting the array 19. The supporting bars 90 may have a square cross-section that fits closely within the cavity 84. Holes 82 are provided through the back of the main body 83, through which gripping screws (not shown) may grip the supporting bars 90 and hold the mounting bracket 80 in position.

The main body 83 may include a further cavity 86 for housing a rechargeable power pack for providing power to the display unit, if required.

Figure 20:
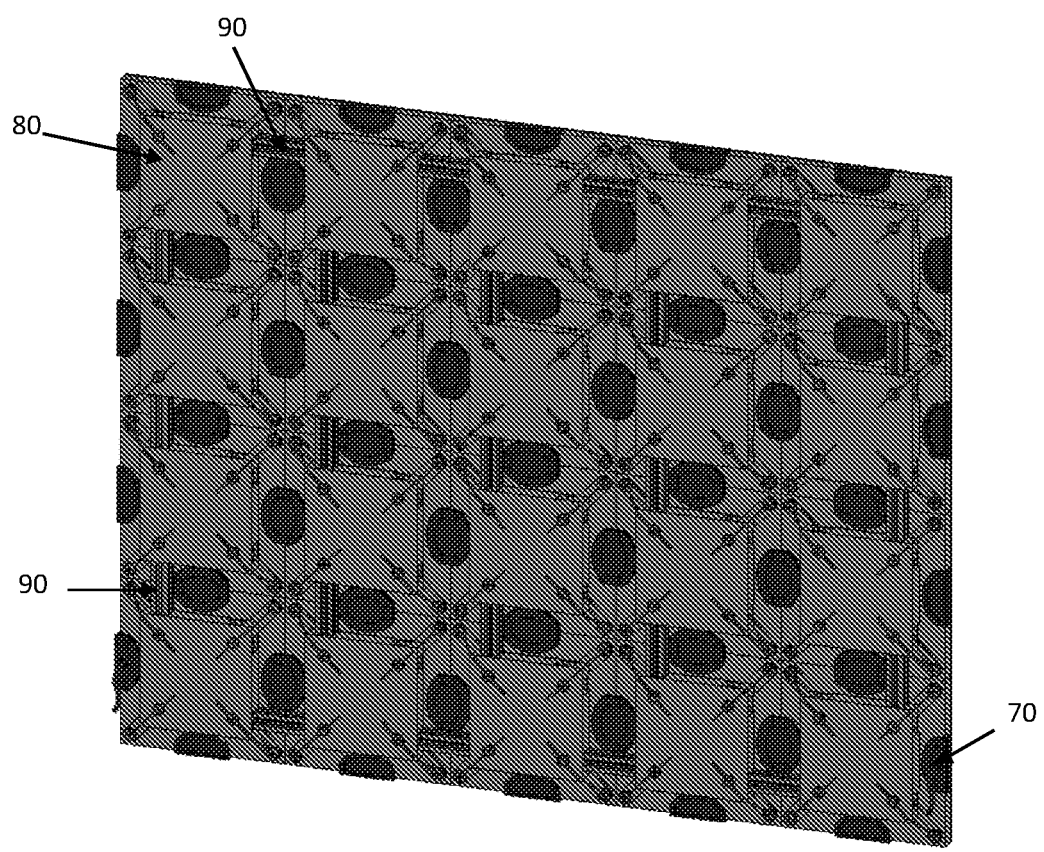
FIG. 20 is a back view of the large format display.

FIG. 20 shows an array 19 of 5×4 display units 18, each having a mounting bracket 80 attached thereto. Supporting bars 90 pass through the mounting brackets 80 and provide structural stability to the array 19. The supporting bars 90 may be of extruded aluminium.

A rechargeable power pack may be provided in one or more of the mounting brackets 80, and may be connected into the array via a power input plug 70.

The array 19 may allow individual display units 18 to be removed for repair or replacement, for example by releasing the display unit 18 from its associated mounting bracket 80. The connection between the display unit and the mounting bracket may be controlled remotely, for example using an electronically controlled latching system, so that it is not necessary to access the back of the array 19.

The connection arrangement is not limited to the configuration of plugs and sockets described above. In an alternative connection arrangement, the socket 30 may instead be arranged as a plug, and the connector plug 50, blank plug 40, power input plug 70 and data input plug 60 may instead be arranged as sockets. Likewise, within the socket 30 the data connection socket 37 may instead be arranged as a data connection plug and/or the power connection sockets 38 may instead be arranged as plugs or pins.

The display unit 18 need not be square or rectangular, but could be another tessellating shape, such as an equilateral triangle or hexagon. The display units 18 may be of different shapes that connect together to form an array 19 of the required shape. The display units 18 may be of shapes that do not tessellate, although this may leave gaps between the display units 18. However, such an appearance may be desirable in certain applications.

More than one power input plug 70 may be connected into the array 19, for example to meet higher power requirements. More than one data input plug 60 may be connected into the array 19, for example to provide multiple video inputs which may displayed alternatively, alternately or simultaneously.

Alternative types of input plug may be provided, for example to provide network connection (e.g. Wi-Fi or Ethernet), direct wireless connection (e.g. Bluetooth®), memory storage, motion detection etc. Hence, the sockets 30 may be able to connect to multiple different types of plug in a plug and play configuration, similar to USB.

Alternative forms of plug may be provided for non-planar connections e.g. angled or right-angled connections.

Figure 21:
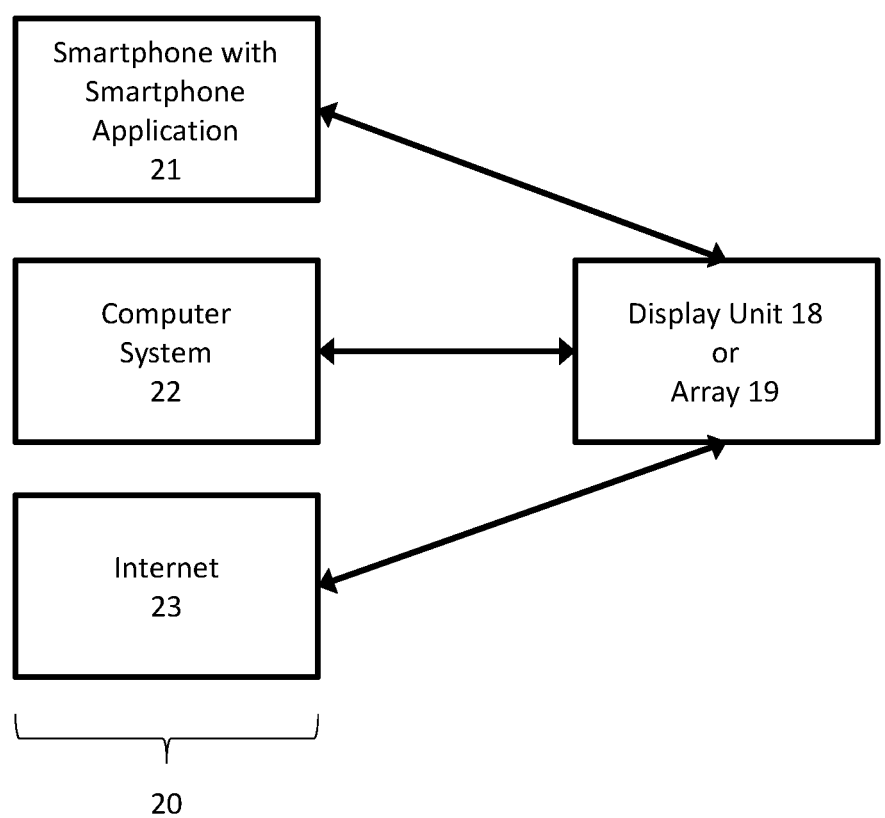
FIG. 21 is a block diagram showing control entities interacting with a display unit or array of display units.

FIG. 21 shows a block diagram demonstrating means by which control entities 20 can interact with a display unit 18 or display units 18 in an array 19 to carry out various function including but not limited to switching on or off the device(s), scheduling functions of the device(s), controlling and amending pre-set schedules of the device(s), transferring display information to the device(s), receiving information from the device(s) and the like. In some embodiments a display unit 18 or an array 19 of display units 18 can be controlled from, for example but not limited to, control entities 20 such as a smartphone application 21, or directly from a computer system 22 at the location of the display unit(s) 18, or by communication from the Internet 23. In embodiments, control software which sends information to a display unit 18 or array 19 of display units 18 uses an encrypted command structure. The encrypted information transferred to the display unit 18 or array 19 of display units 18 instructs the units of the function which they are to perform as well as when to perform said function.

The display unit 18 can be formed in many different physical shapes, such but not limited to: square-shaped, rectangular, circular, semi-circular, quarter-circular, triangular and others.

Alternative embodiments, which may be apparent from reading the above description, may nevertheless fall within the scope of the present invention, for example as defined by the accompanying claims.

The invention claimed is:

1. A display array comprising:
   first and second display units adjoined at adjacent edges thereof, where each of the adjacent edges includes a combined power and data port located in a central portion of a surrounding connection mount, wherein each surrounding connection mount includes a first seal disposed around an outer perimeter of the surrounding connection mount; and
   a removable power and data connector mechanically configured to connect around each of the surrounding connection mounts of the adjacent edges and to contact a portion of the first seal of each of the surrounding connection mounts, the removeable power and data connector configured to provide power and data connections between the combined power and data ports of the first and second display units,
   wherein the removable power and data connector further includes a second seal disposed around an outer perimeter of the removeable power and data connector, the second seal configured to be disposed between the removable power and data connector and the adjacent edges of the first and second displays when the removable power and data connector is connected around each of the surrounding connection mounts, and wherein the first and second seals are configured to inhibit liquid ingress between the removable power and data connector and each of the combined power and data ports.

2. The array of claim 1, wherein the removable power and data connector comprises a housing that extends between the combined power and data ports of the first and second display units and around a portion of each of the surrounding connection mounts of the adjacent edges, the housing configured to provide a substantially rigid mechanical connection therebetween.

3. The array of claim 1, wherein the combined power and data ports are arranged in or on a rear surface of the display units.

4. The array of claim 1, wherein the first and second seals comprises a gasket.

5. The array of claim 1, where the removable power and data connector comprises a plug connector and the combined power and data ports comprise socket connectors.

6. The array of claim 1, wherein each said combined power and data port comprises a physically separate power port and a data port.

7. The array of claim 6, where in the data port comprises a High-Definition Multimedia Interface port.

8. The array of claim 1, wherein each of the first and second display units has at least one additional combined power and data port at a further edge thereof, for connection to a further similar display unit.

9. The array of claim 8, wherein one or more of the at least one additional combined power and data port that is not connected to another display unit is sealed by a blank connector.

10. The array of claim 8, wherein one or more of the at least one additional combined power and data ports, that is not connected to another display unit, is connected to a power connector for providing electrical power to the array.

11. The array of claim 8, wherein one or more of the at least one additional combined power and data port that is not connected to another display unit is connected to a data connector for providing data to the array.

12. A display array comprising:
   first and second display units adjoined at adjacent edges thereof, where each said adjacent edge has a combined power and data port located in a central portion of a surrounding connection mount;
   a removable power and data connector mechanically configured to be connected around each of the surrounding connection mounts of the adjacent edges and configured to provide power and data connections between the combined power and data ports of the first and second display units,
   wherein at least one of the first and second display units are removably connected to respective mounting brackets, the mounting brackets each comprising a plurality of cavities configured to receive a support bar therethrough, wherein at least two of the plurality of cavities of each mounting brackets are disposed orthogonally to each other, and
   wherein the mounting brackets are configured to be interconnected by bars that extend through at least one of the plurality of cavities of adjacent mounting brackets, configured to provide structural integrity to the display array.

13. The array of claim 12, wherein each said display unit is individually removable from its corresponding mounting bracket.

14. The array of claim 12, wherein one of the mounting brackets houses a power source arranged to provide electrical power to the display array.

\* \* \* \* \*